(12) United States Patent
Shiau (10) Patent No.: US 11,852,856 B1
(45) Date of Patent: Dec. 26, 2023

(54) ELECTRONIC DEVICE

(71) Applicant: Wistron Corporation, New Taipei (TW)

(72) Inventor: Yi-Hau Shiau, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 18/153,370

(22) Filed: Jan. 12, 2023

(30) Foreign Application Priority Data

Nov. 18, 2022 (TW) .................................. 111144119

(51) Int. Cl.
*F21V 8/00* (2006.01)
*H02S 40/22* (2014.01)
*H02S 40/38* (2014.01)

(52) U.S. Cl.
CPC ............. *G02B 6/002* (2013.01); *G02B 6/006* (2013.01); *H02S 40/22* (2014.12); *H02S 40/38* (2014.12)

(58) Field of Classification Search
CPC ................................ G02B 6/006; H02S 40/22
See application file for complete search history.

(56) References Cited

FOREIGN PATENT DOCUMENTS

| CN | 103513321 | | 1/2014 |
|---|---|---|---|
| CN | 113436553 A | * | 9/2021 |
| TW | M306336 | | 2/2007 |
| TW | 201413337 | | 4/2014 |

OTHER PUBLICATIONS

"Office Action of Taiwan Counterpart Application", dated Jun. 13, 2023, p. 1-p. 7.

* cited by examiner

*Primary Examiner* — Karabi Guharay
(74) *Attorney, Agent, or Firm* — JCIPRNET (57) ABSTRACT

An electronic device including a front light module, a display, a solar cell module, and a storage battery is provided. The display is disposed under the front light module. The solar cell module is disposed under the front light module and adjacent to the display. The storage battery is electrically connected to the front light module, the display, and the solar cell module.

7 Claims, 7 Drawing Sheets

ELECTRONIC DEVICE

CROSS-REFERENCE TO RELATED APPLICATION

This application claims the priority benefit of Taiwan application serial no. 111144119, filed on Nov. 18, 2022. The entirety of the above-mentioned patent application is hereby incorporated by reference herein and made a part of this specification.

BACKGROUND

Technical Field

The disclosure relates to an electronic device.

Description of Related Art

With global climate change and the impact of the pandemic, ESG has gradually become a subject and an indicator that global companies and investors value very much. ESG, the abbreviation for environmental protection (E, Environmental), social responsibility (S, Social), and corporate governance (G, Governance), is a new type of data and indicators for evaluating enterprises. Therefore, how to make products more friendly to the environment (such as low energy consumption) has become one of the topics researched and developed by researchers.

SUMMARY

The disclosure provides an electronic device, which has low power consumption.

According to an embodiment of the disclosure, the electronic device includes a front light module, a display, a solar cell module, and a storage battery. The display is disposed under the front light module. The solar cell module is disposed under the front light module and adjacent to the display. The storage battery is electrically connected to the front light module, the display, and the solar cell module.

Based on the above, in the electronic device of the disclosure, when the ambient light is sufficient, the solar cell module may receive the ambient light and convert the light energy into electrical energy, the electrical energy may be stored in the storage battery, and the display may use the electrical energy stored in the storage battery to provide a display image. On the other hand, when the ambient light is insufficient, the front light module may use the electrical energy stored in the storage battery to provide light, and in addition to illuminating the display, the light may further be received by the solar cell module and converted into electrical energy and stored in the storage battery. Therefore, the electronic device may have low power consumption.

In order to make the aforementioned features and advantages of the disclosure comprehensible, embodiments accompanied with drawings are described in detail as follows.

DESCRIPTION OF THE EMBODIMENTS

In the following embodiments, terms used to indicate directions, such as "up," "down," "front," "back," "left," and "right," merely refer to directions in the accompanying drawings. Therefore, the directional terms used are regarded as illustrative rather than restrictive of the disclosure. In the accompanying drawings, the drawings illustrate the general features of the methods, structures, or materials used in the particular embodiments. However, the drawings shall not be interpreted as defining or limiting the scope or nature covered by the embodiments. For example, the relative size, thickness, and location of film layers, regions, or structures may be reduced or enlarged for clarity.

In FIGS. 1A to 5B, the same or similar elements will be designated by the same or similar reference numerals, and descriptions thereof will be omitted. In addition, the features of different embodiments may be combined with each other when they are not in conflict, and simple equivalent changes and modifications made according to the specification or the claims are still within the scope of the disclosure.

Figure 1A:
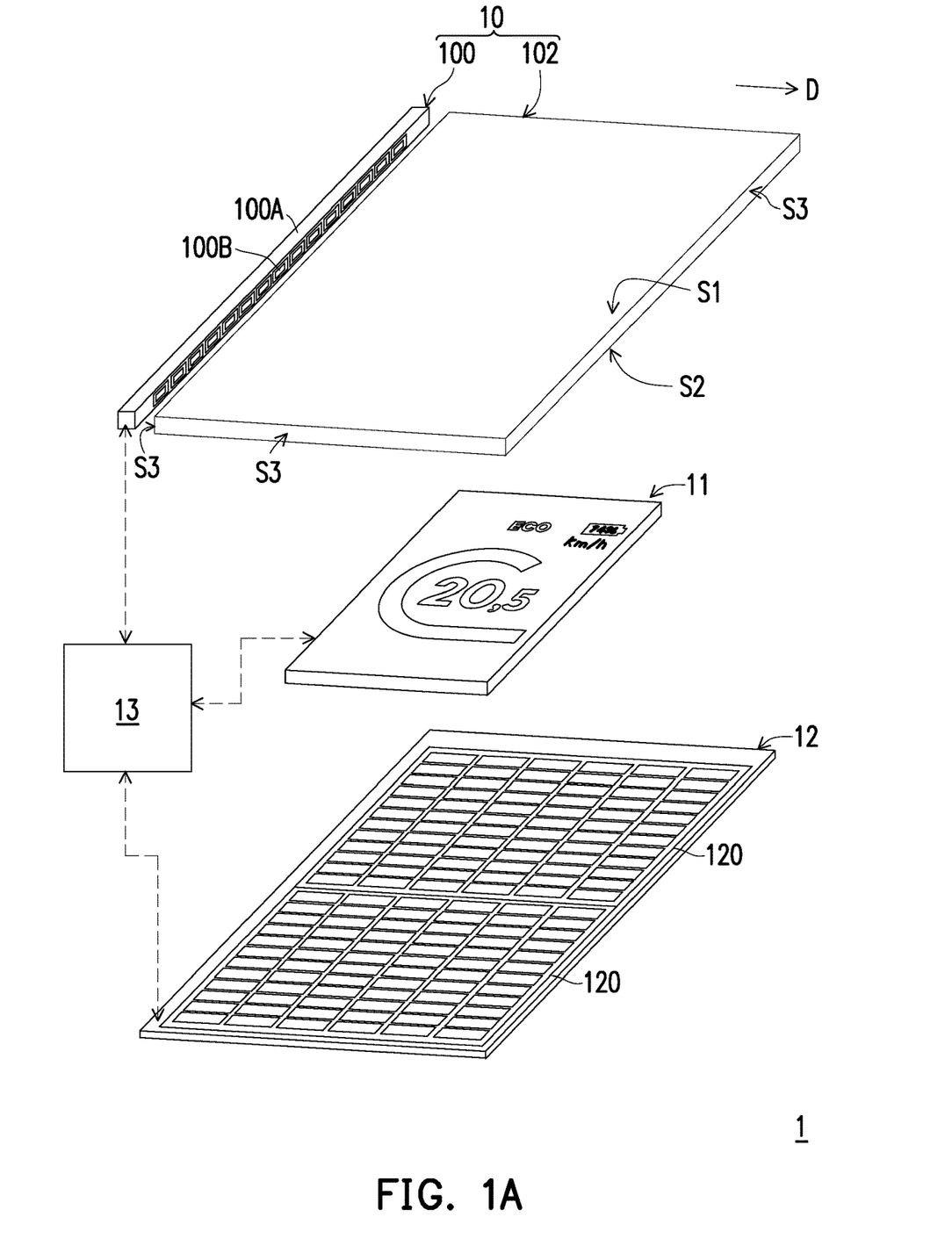
FIG. 1A is an exploded schematic diagram of an electronic device according to a first embodiment of the disclosure.
Figure 1B:
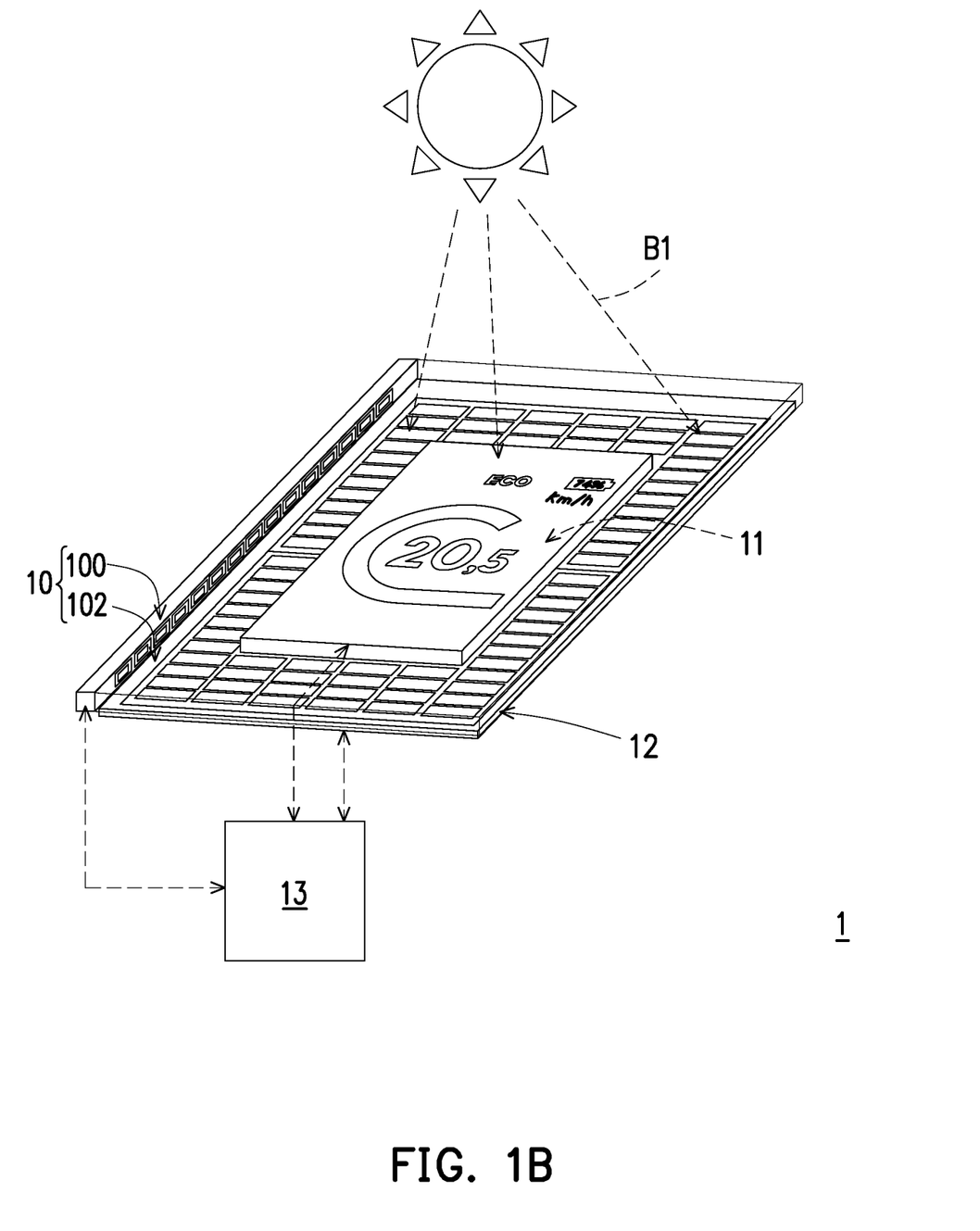
FIGS. 1B and 1C are schematic diagrams of the operation of the electronic device of the first embodiment when the ambient light is sufficient and insufficient, respectively.
Figure 1C:
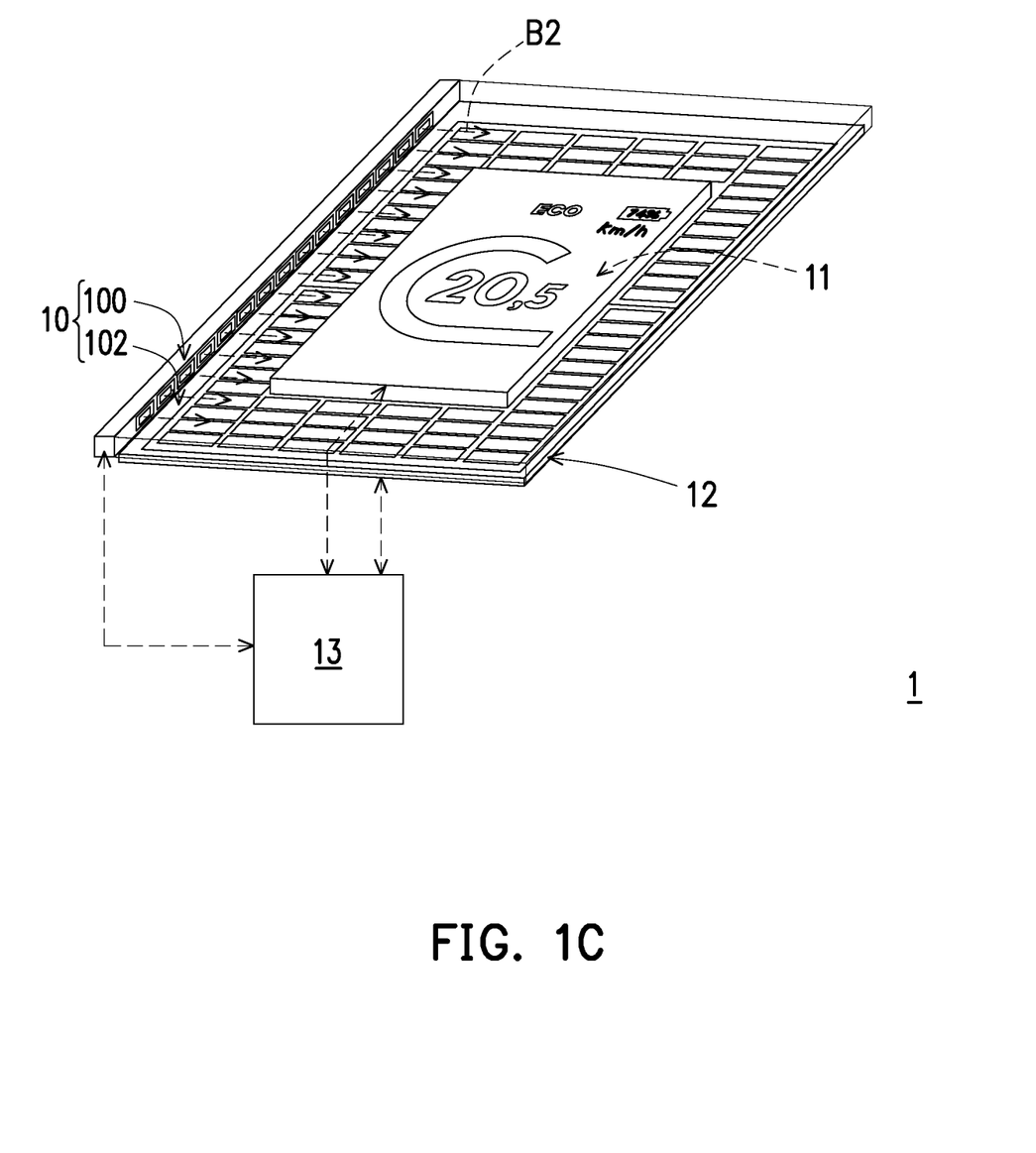

FIG. 1A is an exploded schematic diagram of an electronic device according to a first embodiment of the disclosure. FIGS. 1B and 1C are schematic diagrams of the operation of the electronic device of the first embodiment when the ambient light is sufficient and insufficient, respectively.

Referring to FIG. 1A first, an electronic device 1 is, for example, a device having a display function and a power storage function. For example, the electronic device 1 may be a charging station, an instrument panel, an e-book or other suitable devices, and the electronic device 1 may include a front light module 10, a display 11, a solar cell module 12, and a storage battery 13, but is not limited thereto.

The front light module 10 is configured to provide light. For example, the front light module 10 may include a light source 100 and a light guide plate 102, but is not limited thereto. In some embodiments, the light source 100 may be disposed on a side of the light guide plate 102. In other words, the front light module 10 may be a side light incidence type light source module, and the light emitted by the light source 100 enters the light guide plate 102 through a side wall surface S3 of the light guide plate 102.

In some embodiments, the light source 100 may include a circuit board 100A and multiple light emitting elements 100B, but is not limited thereto. The circuit board 100A may be a printed circuit board (PCB), a flexible printed circuit board (FPCB) or a board with circuits disposed thereon, but is not limited thereto.

The light emitting elements 100B are disposed on a surface of the circuit board 100A facing the light guide plate 102 and are electrically connected to the circuit board 100A. In some embodiments, the light emitting element 100B may be a light emitting diode die. In other embodiments, the light emitting element 100B may be a light emitting diode package. In some other embodiments, although not shown, the light emitting element 100B may include a light emitting diode package and a lens covering the light emitting diode package, but is not limited thereto. In addition, the light emitting elements 100B may be light emitting elements of the same color, such as light emitting elements that provide white light, but are not limited thereto.

The light guide plate 102 may be a rectangular board, such as a square plate or a rectangular plate, but the shape of the light guide plate 102 is not limited thereto. The light guide plate 102 may be made of a high light transmittance material. The high light transmittance material may include polycarbonate (PC), polymethyl methacrylate (PMMA) or MS resin (MSRESIN), but is not limited thereto.

The light guide plate 102 has an upper surface S1, a lower surface S2 opposite to the upper surface S1, and the side wall surface S3 between the upper surface S1 and the lower surface S2. Taking a rectangular plate as an example, the light guide plate 102 may have four side wall surfaces S3, and the light source 100 may be disposed adjacent to one of the side wall surfaces S3, but not limited thereto. In other embodiments, although not shown, the front light module 10 may include multiple light sources 100, and the light sources 100 may be disposed adjacent to the side wall surfaces S3.

In some embodiments, the light guide plate 102 may have multiple light guide microstructures (not shown in FIGS. 1A to 1C), and the light guide microstructures may overlap the display 11 and the solar cell module 12. The light guide microstructures are configured, for example, to destroy total reflection, so that the light transmitted in the light guide plate 102 is emitted from the lower surface S2 of the light guide plate 102 and transmitted to the display 11 or the solar cell module 12.

For example, the light guide microstructures may be multiple hemispherical microstructures recessed on the upper surface S1 of the light guide plate 102. The hemisphere is not limited to half of a sphere, but generally refers to a non-complete sphere. In some embodiments, the hemispherical microstructures have a single size. In other embodiments, the hemispherical microstructures have various sizes. The light guide microstructures and the main body of the light guide plate may be integrally formed by injection molding, but not limited thereto. The light guide microstructures may also be formed on the upper surface S1 of the light guide plate 102 by pressing (such as roller pressing or planar pressing).

The higher the distribution density of the light guide microstructures is, the higher the light intensity at the corresponding position of the light spot in the observation plane below is. Since the light intensity of the light transmitted in the light guide plate 102 is stronger as the light gets closer to the light source 100, in some embodiments, the distribution density of the light guide microstructures may be increased in a direction D away from the light source 100 to improve the uniformity of the light emitted from the lower surface S2 of the light guide plate 102.

The display 11 is disposed under the front light module 10 and disposed, for example, between the front light module 10 and the solar cell module 12. The display 11 may be a reflective display to reduce display power consumption or improve viewing quality (for example, to improve problems such as glare or insufficient image light intensity that occur when electronic devices are used in the hot sun). The reflective display may include a liquid crystal type reflective display, an electrophoretic display, or a cholesteric liquid crystal display, but is not limited thereto. In other embodiments, the display 11 may be a transflective display.

The solar cell module 12 is disposed under the front light module 10 and adjacent to the display 11. In some embodiments, the solar cell module 12 may include multiple solar cell panels 120, and the solar cell panels are spliced together to have a larger light receiving area or increase power generation efficiency, but not limited thereto.

The storage battery 13 is electrically connected to the front light module 10, the display 11, and the solar cell module 12. The storage battery 13 may receive and store the electrical energy generated by the solar cell module 12, and the storage battery 13 may supply the electrical energy required for the front light module 10 and the display 11 to work.

In detail, as shown in FIG. 1B, when the ambient light is sufficient, for example, when the electronic device 1 is used in the hot sun or indoors with sufficient lighting, the solar cell module 12 may receive the ambient light (such as sunlight B1 or light) and convert the light energy into electrical energy, the electrical energy may be stored in the storage battery 13, and the display 11 may use the electrical energy stored in the storage battery 13 to provide a display image. Since the ambient light is sufficient, the ambient light may be used as the light source of the display 11 without turning on the light source 100. In other words, when the ambient light is sufficient, the light source 100 is, for example, turned off.

On the other hand, as shown in FIG. 1C, when the ambient light is insufficient, for example, when the electronic device 1 is used at dusk, at night or indoors with insufficient lighting, in addition to the display 11 using the electrical energy stored in the storage battery 13 to provide the display image, the front light module 10 (such as the light source 100 of the front light module may also use the electrical energy stored in the storage battery 13 to provide light B2. A part of the light B2 may illuminate the display 11, so that a user can see the display image clearly even when the ambient light is insufficient, and the rest of the light B2 may be received by the solar cell module 12 and converted into electrical energy and stored in the storage battery 13. In other words, when the ambient light is insufficient, the light source 100 is, for example, turned on.

Generating at least part of the electrical energy for display and/or illumination through the solar cell module 12 and storing the electricity through the storage battery 13 may reduce the charging frequency or time of the electronic device 1, and thus the electronic device 1 may have low energy consumption and meet the standards of energy saving and carbon reduction or environmental protection.

According to different requirements, the electronic device 1 may further include other elements or film layers. For example, although not shown, the electronic device 1 may further include an ambient light sensor to sense the intensity of ambient light, so as to determine whether the light source 100 needs to be turned on. Although not shown, the electronic device 1 may further include a solar cell module reminder light to remind the status of the solar cell module 12, for example, whether the solar cell module 12 is in operation or whether a problem exists and detection or replacement is required. Similarly, although not shown, the electronic device 1 may further include a storage battery reminder light to remind the status of the storage battery 13, for example, the remaining power or whether a problem exists and detection or replacement is required. Although not shown, the electronic device 1 may further include one or more layers of optical films, such as anti-glare films or anti-fouling films, but not limited thereto.

Figure 2:
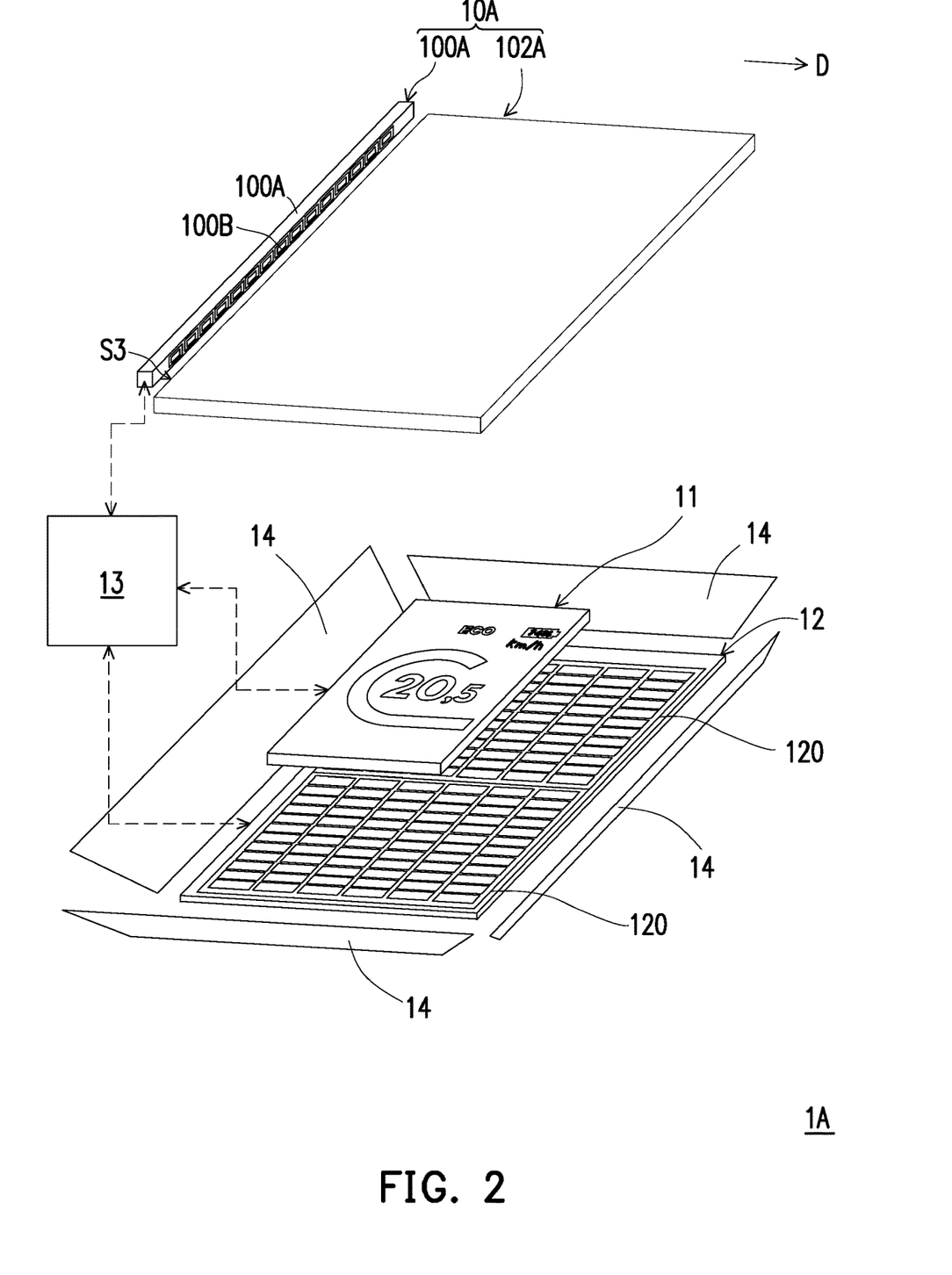
FIG. 2 is an exploded schematic diagram of an electronic device according to a second embodiment of the disclosure.
Figure 3:
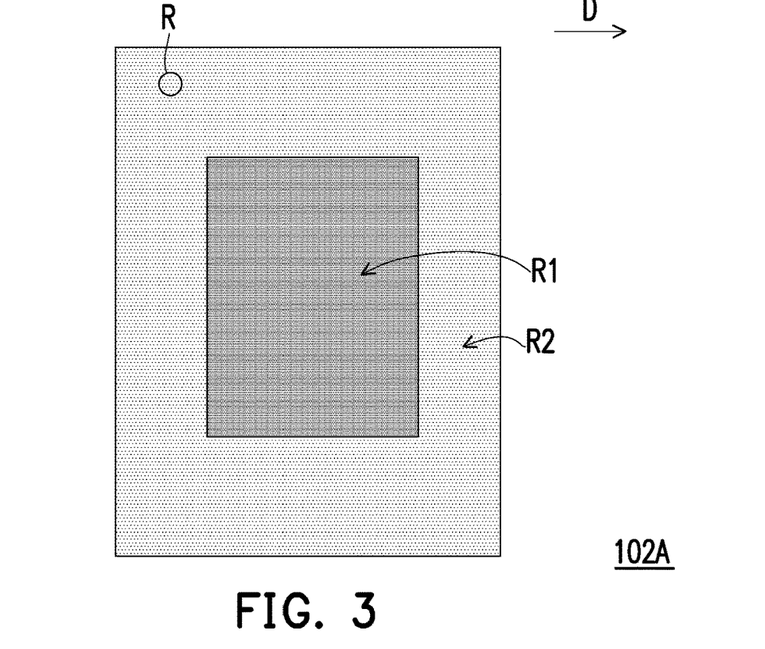
FIG. 3 is a schematic top view of the light guide plate in FIG. 2.
Figure 4A:
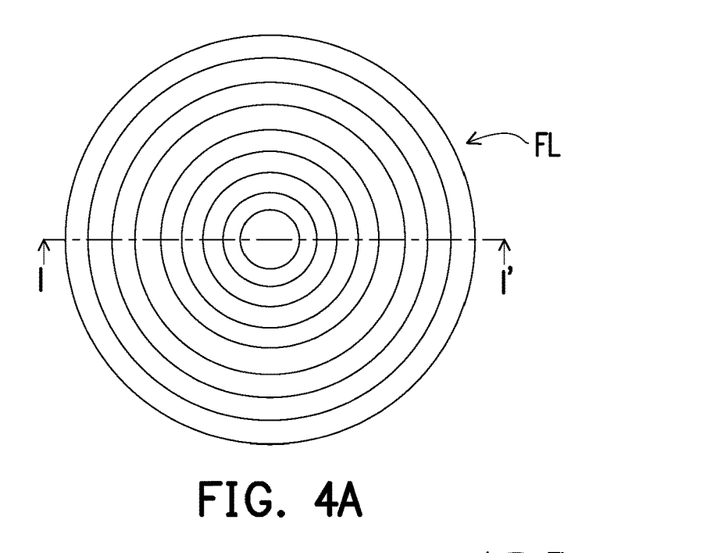
FIG. 4A is an enlarged schematic view of the region R in FIG. 3.
Figure 4B:
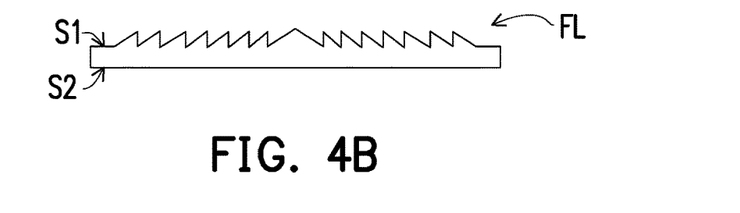
FIG. 4B is a schematic cross-sectional view taken along the section line I-I' in FIG. 4A.

FIG. 2 is an exploded schematic diagram of an electronic device according to a second embodiment of the disclosure. FIG. 3 is a schematic top view of the light guide plate in FIG. 2. FIG. 4A is an enlarged schematic view of the region R in FIG. 3. FIG. 4B is a schematic cross-sectional view taken along the section line I-I' in FIG. 4A.

Referring to FIGS. 2 to 4B, the main differences between an electronic device 1A and the electronic device 1 of FIG. 1A are described as follows. In a front light module 10A of the electronic device 1A, a light guide plate 102A has a first region R1 disposed corresponding to the display 11 and a second region R2 disposed corresponding to the solar cell module 12. The first region R1 overlaps the display 11 in a thickness direction of the electronic device 1A, and the second region R2 overlaps the solar cell module 12 in the thickness direction of the electronic device 1A. As shown in FIG. 3, the second region R2 surrounds, for example, the first region R1, but is not limited thereto. The relative disposition relationship between the second region R2 and the first region R1 may be changed according to the relative disposition relationship between the display 11 and the solar cell module 12.

In the first region R1, the light guide plate 102A may have multiple light guide microstructures (not shown). The details of the light guide microstructures may be referred to above, and are not repeated here. In the second region R2, the light guide plate 102A may have multiple light concentrating microstructures to concentrate the ambient light to the solar cell module 12. The light concentrating microstructures may include multiple Fresnel lenses, but are not limited thereto. FIGS. 4A and 4B schematically illustrate a Fresnel lens FL. However, it should be understood that the second region R2 may include multiple Fresnel lenses FL. The Fresnel lenses FL are formed, for example, on the upper surface S1 of the light guide plate 102A, and the Fresnel lenses FL may be arranged in an array, arranged in a staggered manner or distributed randomly, which is not limited in the embodiment.

The light concentrating microstructures, the light guide microstructures, and the main body of the light guide plate may be integrally formed by injection molding, but not limited thereto. The light concentrating microstructures and the light guide microstructures may also be formed on the upper surface S1 of the light guide plate 102A by pressing (such as roller pressing or planar pressing).

Referring to FIG. 2, the electronic device 1A may further include multiple reflectors 14 to reflect the ambient light to the solar cell module 12 for secondary light collection. The reflectors 14 surround the display 11 and are disposed between the front light module 10A and the solar cell module 12. In some embodiments, the reflectors 14 are disposed obliquely relative to the display 11. For example, the interior angle formed between the reflector 14 and the front light module is smaller than the interior angle formed between the reflector 14 and the solar cell module 12, but not limited thereto.

According to different requirements, the electronic device 1A may also include other elements or film layers, such as at least one of the aforementioned ambient light sensor, the solar cell module reminder light, the storage battery reminder light, and the optical films (such as anti-glare films and anti-fouling films).

Figure 5A:
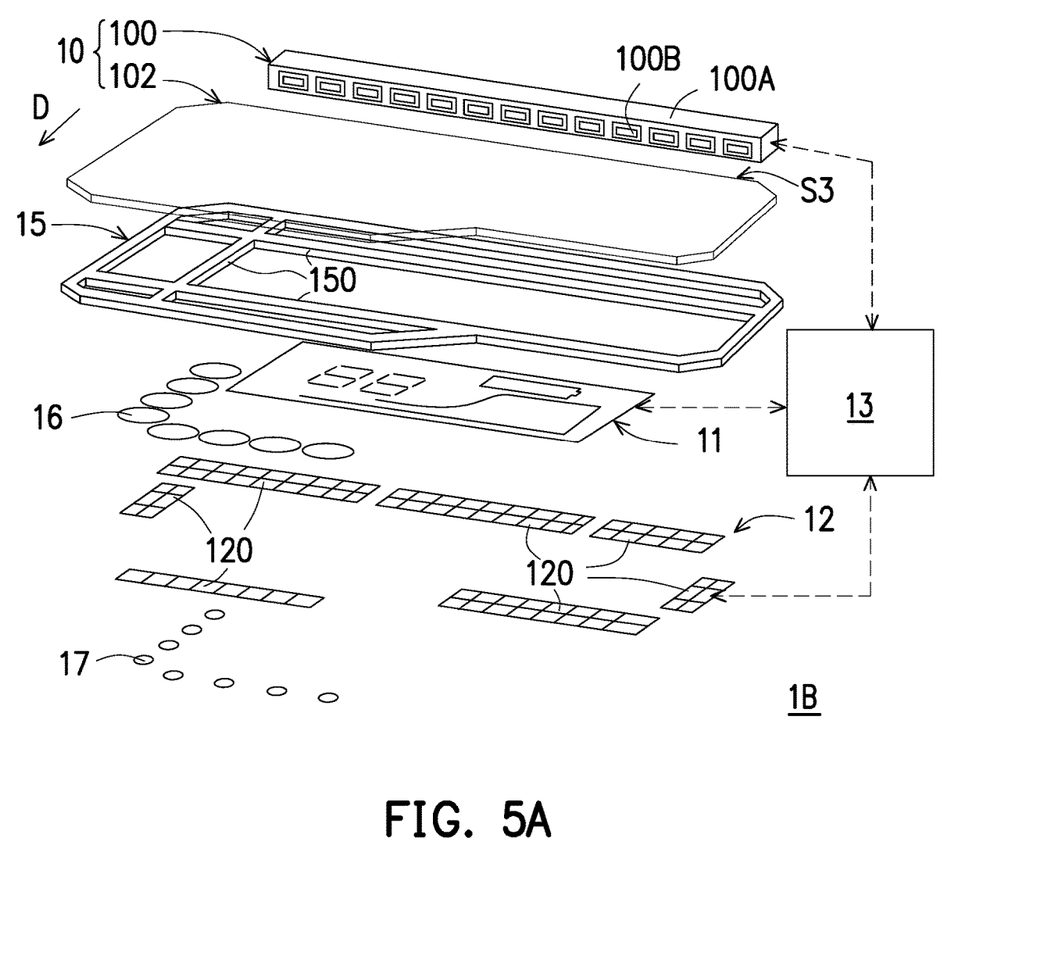
FIGS. 5A and 5B are respectively an exploded view and a top view of an electronic device according to a third embodiment of the disclosure.
Figure 5B:
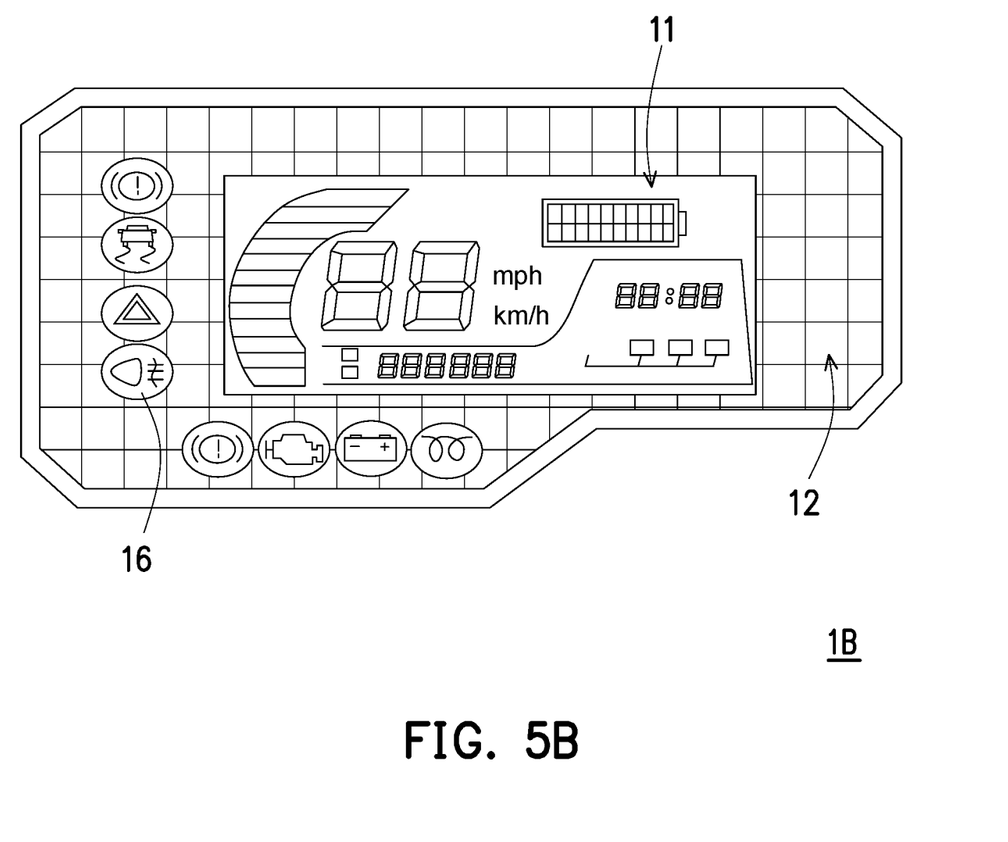

FIGS. 5A and 5B are respectively an exploded view and a top view of an electronic device according to a third embodiment of the disclosure.

Referring to FIGS. 5A and 5B, the main differences between an electronic device 1B and the electronic device 1 of FIG. 1A are described as follows. In the electronic device 1B, the solar cell module 12 surrounds the display 11. In other words, the solar cell module 12 does not overlap the display 11 in the thickness direction of the electronic device 1B.

The electronic device 1B may further include a decorative layer 15. The decorative layer is disposed between the front light module 10 and the solar cell module 12. The decorative layer 15 may include multiple decorative lines 150, and the decorative lines 150 are respectively disposed corresponding to multiple stitching lines of the solar cell module 12 (not shown; for example, gaps between the solar cell panels 120 and the display 11, but not limited thereto), to reduce the visibility of the stitching lines of the solar cell module 12. The material of the decorative layer 15 may include black, gray or white light shielding materials, such as a black matrix, but not limited thereto.

The electronic device 1B may further include multiple reminder patterns 16 and multiple light emitting elements 17. The reminder patterns 16 are disposed between the front light module and the solar cell module 12, and may be located beside the display 11. Taking an electric vehicle as an example, the reminder patterns 16 may include an engine reminder, a warning light, remaining power, etc., but not limited thereto. The material of the reminder patterns 16 may include ink, a black matrix or other suitable materials. In addition, the reminder patterns 16 and the decorative layer 15 may be the same or different layers.

The light emitting elements 17 are respectively disposed under the reminder patterns 16, and the light emitting elements 17 may be operated independently to light up the corresponding reminder patterns. For details of the light emitting elements 17, reference may be made to the related description of the light emitting elements 100B, which is not repeated here.

According to different requirements, the electronic device 1B may also include other elements or film layers, such as at least one of the aforementioned ambient light sensor, the solar cell module reminder light, the storage battery reminder light, and the optical films (such as anti-glare films and anti-fouling films).

To sum up, in the electronic device of the disclosure, generating at least part of the electrical energy for display and/or illumination through the solar cell module and storing the electricity through the storage battery may reduce the charging frequency or time of the electronic device, and thus the electronic device may have low energy consumption and meet the standards of energy saving and carbon reduction or environmental protection.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. An electronic device, comprising:
a front light module;
a display, disposed under the front light module;
a solar cell module, disposed under the front light module and adjacent to the display; and
a storage battery, electrically connected to the front light module, the display, and the solar cell module, wherein the front light module comprises:

a light guide plate, disposed over the display; and a light source, disposed on a side of the light guide plate, wherein the light guide plate has a first region disposed corresponding to the display and a second region disposed corresponding to the solar cell module, wherein:

in the first region, the light guide plate has a plurality of light guide microstructures; and in the second region, the light guide plate has a plurality of light concentrating microstructures.

2. The electronic device according to claim 1, wherein distribution density of the plurality of light guide microstructures increases away from the light source.

3. The electronic device according to claim 1, wherein the plurality of light concentrating microstructures comprise a plurality of Fresnel lenses.

4. The electronic device according to claim 1, wherein the display is disposed between the front light module and the solar cell module, and the electronic device further comprises:

a plurality of reflectors, surrounding the display and being disposed between the front light module and the solar cell module.

5. The electronic device according to claim 1, wherein the solar cell module surrounds the display.

6. The electronic device according to claim 5, further comprising:

a decorative layer, disposed between the front light module and the solar cell module, wherein the decorative layer comprises a plurality of decorative lines, and the plurality of decorative lines are respectively disposed corresponding to a plurality of stitching lines of the solar cell module.

7. The electronic device according to claim 6, further comprising:

a plurality of reminder patterns, disposed between the front light module and the solar cell module and located beside the display; and a plurality of light emitting elements, respectively disposed under the plurality of reminder patterns.

* * * * *